United States Patent
Orihara et al.

(10) Patent No.: US 8,878,984 B2
(45) Date of Patent: Nov. 4, 2014

(54) IMAGE-ACQUISITION DEVICE AND METHOD OF FABRICATING THE SAME

(71) Applicant: Olympus Medical Systems Corp., Tokyo (JP)

(72) Inventors: Tatsuya Orihara, Tokyo (JP); Mitsujiro Konno, Tokyo (JP)

(73) Assignee: Olympus Medical Systems Corp., Tokyo (JP)

( * ) Notice: Subject to any disclaimer, the term of this patent is extended or adjusted under 35 U.S.C. 154(b) by 0 days.

(21) Appl. No.: 13/784,263

(22) Filed: Mar. 4, 2013

(65) Prior Publication Data

US 2013/0208179 A1     Aug. 15, 2013

Related U.S. Application Data

(63) Continuation of application No. PCT/JP2012/066803, filed on Jun. 29, 2012.

(30) Foreign Application Priority Data

Aug. 9, 2011   (JP) ................................. 2011-174089

(51) Int. Cl.
*H04N 5/225*     (2006.01)
*H01L 27/146*     (2006.01)

(52) U.S. Cl.
CPC ........... *H04N 5/2254* (2013.01); *H04N 5/2257* (2013.01); *H01L 27/14623* (2013.01); *H01L 27/14618* (2013.01); *H01L 27/14625* (2013.01)
USPC .......................................... 348/369; 348/335

(58) Field of Classification Search
CPC . H04N 5/2259; H04N 5/23212; H04N 5/232; H04N 5/225; H04N 5/2253; H01L 27/14627; G08B 13/19626; G02B 27/144; G02B 7/023; G02B 7/004; G03F 7/70825
USPC .................. 348/335–344, 369, 65; 359/822, 359/831–833
See application file for complete search history.

(56) References Cited

U.S. PATENT DOCUMENTS 4,746,203 A * 5/1988 Nishioka et al. ............... 359/834
4,809,680 A * 3/1989 Yabe ............................. 600/130

(Continued)

FOREIGN PATENT DOCUMENTS

| JP | 63-127444 | 5/1988 |
| JP | 11-326766 | 11/1999 |
| JP | 2009-288682 | 12/2009 |

OTHER PUBLICATIONS

International Search Report, dated Sep. 18, 2012, issued in corresponding International Application No. PCT/JP2012/066803.

*Primary Examiner* — Aung S Moe
(74) *Attorney, Agent, or Firm* — Kenyon & Kenyon LLP

(57) ABSTRACT

Provided is an image-acquisition device including an image acquisition element; a prism that is secured to the image-acquisition element and that has an entrance surface through which light enters from a direction that intersects an optical axis of the image-acquisition element, an exit surface that is substantially parallel to an image-acquisition surface of the image-acquisition element, and a reflection surface that deflects the light that has entered through the entrance surface toward a direction that is parallel to the optical axis of the image-acquisition element; and a cover member that is secured at a position that covers the reflection surface of the prism and that has an outer surface that is substantially parallel to the image-acquisition surface, wherein an end surface of the cover member closer to the entrance surface is disposed at a position protruding beyond the entrance surface.

7 Claims, 10 Drawing Sheets

(56) References Cited

U.S. PATENT DOCUMENTS

| | | | |
|---|---|---|---|
| 5,365,268 A * | 11/1994 | Minami | 348/76 |
| 6,084,715 A | 7/2000 | Aoki et al. | |
| 6,392,703 B1 * | 5/2002 | Uchino et al. | 348/373 |
| 8,208,015 B2 * | 6/2012 | Unsai et al. | 348/65 |
| 8,456,562 B2 * | 6/2013 | Ishii | 348/335 |
| 2001/0027125 A1 * | 10/2001 | Kiyomatsu et al. | 455/566 |
| 2006/0146176 A1 * | 7/2006 | Kato et al. | 348/360 |
| 2007/0115376 A1 * | 5/2007 | Igarashi | 348/262 |
| 2009/0086337 A1 * | 4/2009 | Kondo | 359/700 |
| 2009/0102961 A1 * | 4/2009 | Uzawa | 348/345 |
| 2009/0296235 A1 | 12/2009 | Igarashi | |
| 2012/0182458 A1 * | 7/2012 | Ishii | 348/340 |

* cited by examiner

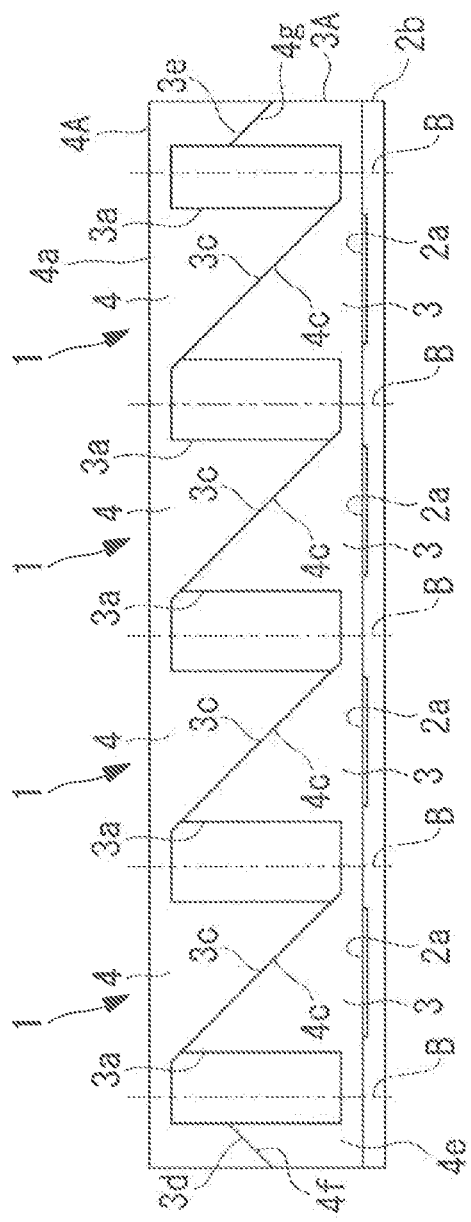

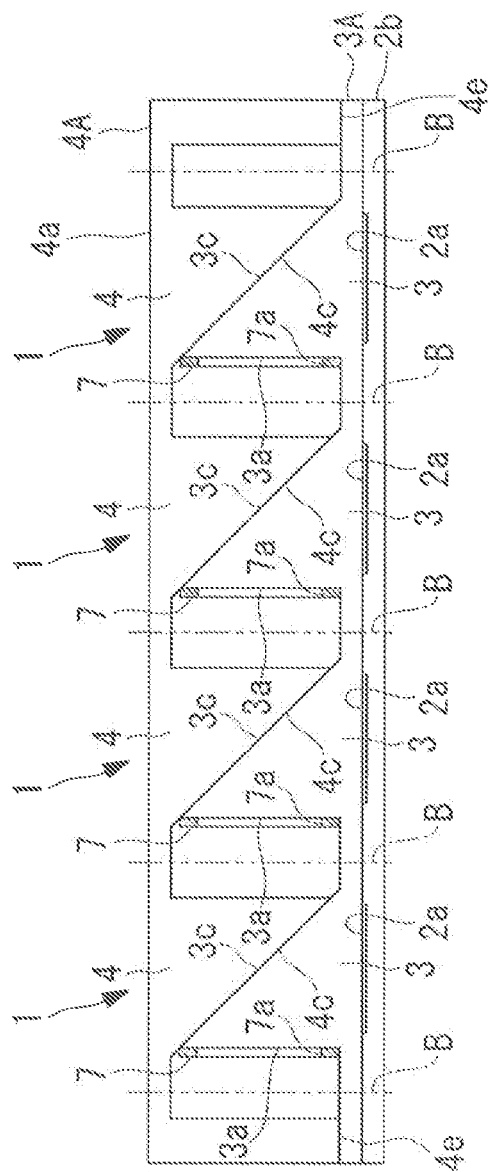

IMAGE-ACQUISITION DEVICE AND METHOD OF FABRICATING THE SAME

CROSS-REFERENCE TO RELATED APPLICATIONS

This is a continuation of International Application PCT/JP2012/066803, with an international filing date of Jun. 29, 2012, which is hereby incorporated by reference herein in its entirety. This application claims the benefit of Japanese Patent Application No. 2011-174089, the content of which is incorporated herein by reference.

TECHNICAL FIELD

The present invention relates to an image-acquisition device and a method of fabricating the same.

BACKGROUND ART

In the related art, there is a known method in which a plurality of optical heads are fabricated by attaching rod-shaped prisms on a plurality of semiconductor elements fabricated on a silicon wafer, and then subsequently cutting the integrally formed silicon wafer, semiconductor elements, and prisms.

CITATION LIST

Patent Literature

{PTL 1} Japanese Unexamined Patent Application, Publication No. Sho 63-127444

SUMMARY OF INVENTION

Technical Problem

In the case of an image-acquisition device that is provided with a prism into which light enters from a direction that intersects the optical axis of an image-acquisition element and with which the light that has entered thereinto is made to enter the image-acquisition element by being reflected at a reflection surface, as in the case where the prism to be attached is a triangular prism, because the reflection surface is disposed in an inclined manner with respect to the image-acquisition element, it is difficult to handle a singulated image-acquisition device by means of suction after cutting.

The present invention provides an image-acquisition device that can be fabricated in a simple manner and that can easily be handled by means of suction even in a singulated form, as well as a method of fabricating the same.

Solution to Problem

An aspect of the present invention is an image-acquisition device including an image-acquisition element; a prism that is secured to the image-acquisition element and that has an entrance surface through which light enters from a direction that intersects an optical axis of the image-acquisition element, an exit surface that is substantially parallel to an image-acquisition surface of the image-acquisition element, and a reflection surface that deflects the light that has entered through the entrance surface toward a direction that is parallel to the optical axis of the image-acquisition element; and a cover member that is secured at a position that covers the reflection surface of the prism and that has an outer surface that is substantially parallel to the image-acquisition surface, wherein an end surface of the cover member closer to the entrance surface may be disposed at a position protruding beyond the entrance surface.

In the above-described aspect, an end surface of the image-acquisition element closer to the entrance surface may be disposed at a position protruding beyond the entrance surface.

In addition, in the above-described aspect, the prism may be provided with a plurality of reflection surfaces, and the cover member may be secured at a position where at least one of the reflection surfaces is covered.

In the above-described aspect, a light-blocking member that blocks light at a periphery may be disposed at the entrance surface or the exit surface of the prism.

In addition, in the above-described aspect, a lens may be provided at the image-acquisition surface of the image-acquisition element, and an air layer may be provided between the image-acquisition element and the exit surface of the prism by means of the thickness of the light-blocking member.

BRIEF DESCRIPTION OF DRAWINGS

FIG. 7 is a side view showing a third modification of the image-acquisition elements, the triangular prisms, and the cover members in FIG. 3.

FIG. 8A is a diagram of a fourth modification of the image-acquisition elements, the triangular prisms, and the cover members in FIG. 3, showing a side view of entrance surfaces provided with light-blocking members.

FIG. 8B is a diagram of the fourth modification of the image-acquisition elements, the triangular prisms, and the cover members in FIG. 3, showing a front view of the light-blocking member.

DESCRIPTION OF EMBODIMENT

An image-acquisition device 1 and a method of fabricating the same according to an embodiment of the present invention will be described below with reference to the drawings.

Figure 1:
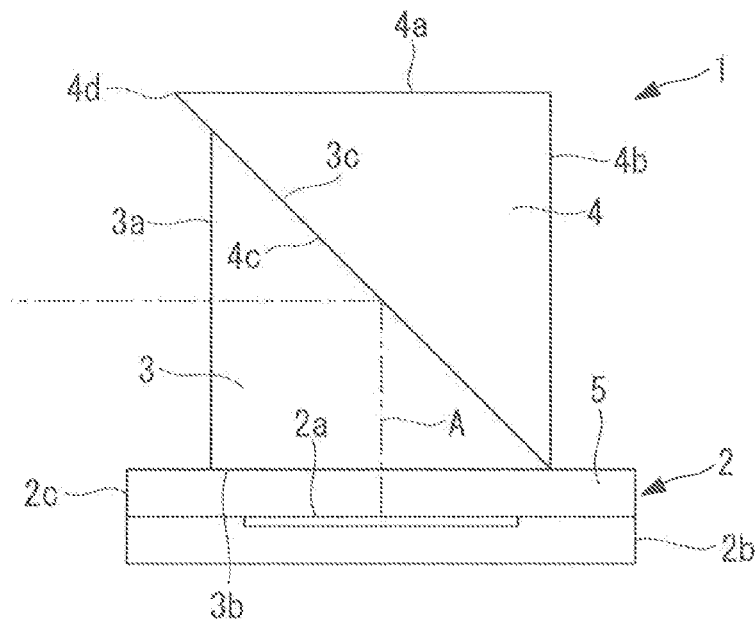
FIG. 1 is a side view showing an image-acquisition device according to an embodiment of the present invention.
Figure 2:
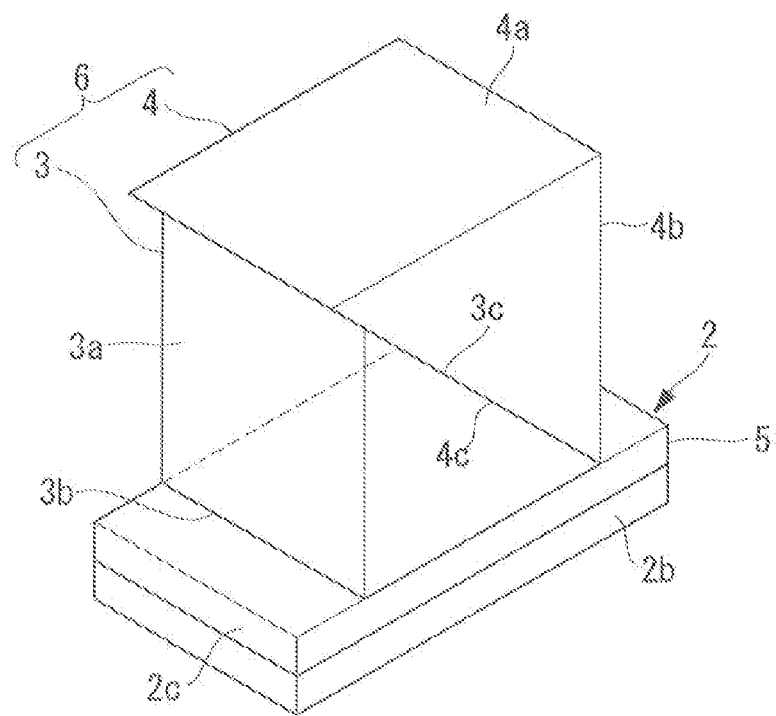
FIG. 2 is a perspective view showing the image-acquisition device in FIG. 1.

As shown in FIGS. 1 and 2, the image-acquisition device 1 according to this embodiment is provided with a flat plate-shaped image-acquisition element 2, a triangular prism 3 that is secured to a surface of the image-acquisition element 2, and a cover member 4 that is secured so as to cover the triangular prism 3. In the figures, reference sign 5 indicates a transparent cover glass that forms a portion of the image-acquisition element 2 by covering an image-acquisition surface 2a of the image-acquisition element 2.

The image-acquisition element 2 is fabricated on a silicon wafer by means of a semiconductor fabrication process, has the image-acquisition surface 2a through which light enters, and also converts the light that has entered through the image-acquisition surface 2a into electrical signals, thus forming an image.

The triangular prism 3 is provided with an entrance surface 3a and exit surface 3b that are perpendicular to each other, as well as a reflection surface 3c that forms 45° angles with respect to the entrance surface 3a and the exit surface 3b, and is secured to the image-acquisition element 2 in a state in which the exit surface 3b is disposed so as to be substantially parallel to the image-acquisition surface 2a of the image-acquisition element 2. By doing so, light from a direction that is substantially parallel to the image-acquisition surface 2a perpendicularly enters the entrance surface 3a and is deflected 90° by the reflection surface 3c so as to exit from the exit surface 3b in a direction perpendicular to the exit surface 3b.

Because the exit surface 3b and the image-acquisition surface 2a are disposed substantially parallel to each other, the light exiting from the exit surface 3b is made to enter the image-acquisition surface 2a from a direction parallel to an optical axis A of the image-acquisition element 2. Here, the optical axis A of the image-acquisition element 2 is perpendicular to the image-acquisition surface and is a line that passes through substantially the center of an image-acquisition region of the image-acquisition element.

In addition, the entrance surface 3a of the triangular prism 3 is disposed at a position that is withdrawn from an end surface 2c of the image-acquisition element 2.

The cover member 4 is a triangular columnar member that has a slightly larger size than the triangular prism 3 and a substantially similar lateral cross-sectional shape therewith, and that is provided with two outer surfaces 4a and 4b that are perpendicular to each other, as well as a covering surface 4c that is inclined substantially at 45° angles with respect to the outer surfaces. Then, the cover member 4 is secured to the triangular prism 3 by means of an adhesive so that the covering surface 4c is in close contact with the reflection surface 3c of the triangular prism 3.

The cover member 4 is formed of a material having a refractive index greatly differing from that of the triangular prism 3, and, accordingly, light that has entered the triangular prism 3 is totally reflected at the reflection surface 3c and subsequently exits toward the image-acquisition element 2 from the exit surface 3b without exiting from the reflection surface 3c toward the cover member 4.

In addition, an edge 4d of the cover member 4 is disposed at a position protruding beyond the entrance surface 3a of the triangular prism 3.

A method of fabricating the thus-configured image-acquisition device 1 according to this embodiment will be described below.

Figure 3:
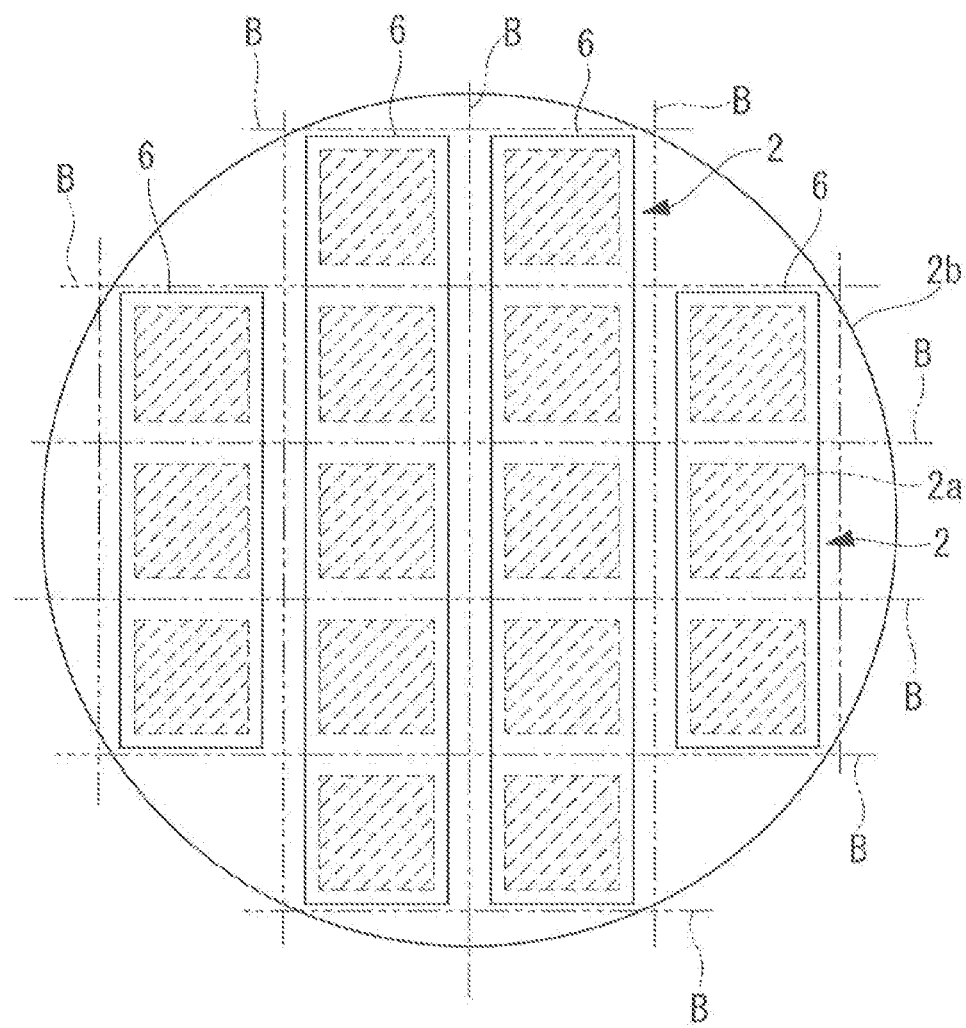
FIG. 3 is a plan view showing triangular prisms disposed so as to extend across a plurality of image-acquisition elements formed on a silicon wafer in the process of fabricating the image-acquisition device in FIG. 1.

As shown in FIG. 3, in order to fabricate the image-acquisition device 1 according to this embodiment, first, the image-acquisition elements 2 having numerous image-acquisition surfaces 2a that are arrayed in rows and columns are fabricated on a silicon wafer 2b by means of a semiconductor fabrication process.

Next, a plurality of the rod-shaped triangular prisms 3 having lengths that extend across numerous image-acquisition elements 2 arrayed in one direction of the silicon wafer 2b are prepared. In addition, the cover members 4 having the same lengths as the triangular prisms 3 are prepared in the same number as the number of the triangular prisms 3.

Then, the reflection surfaces 3c and the covering surfaces 4c are attached so that the reflection surfaces 3c of the triangular prisms 3 are covered with the covering surfaces 4c of the cover members 4. By doing so, numerous rectangular columnar optical members 6 are fabricated.

Figure 4:
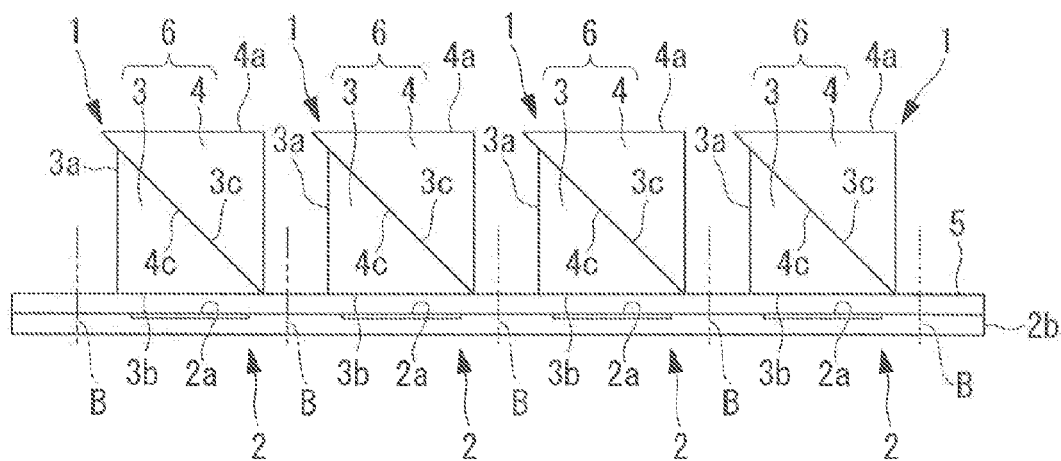
FIG. 4 is a side view of the image-acquisition elements, the triangular prisms, and cover members in FIG. 3.

As shown in FIGS. 3 and 4, the fabricated rectangular columnar optical members 6 are subsequently attached to the image-acquisition elements 2 so that the exit surfaces 3b of the triangular prisms 3 are substantially parallel to the surfaces of the image-acquisition elements 2 at the image-acquisition surfaces 2a. At this time, as shown in FIG. 3, the individual optical members 6 are disposed so as to extend across numerous image-acquisition elements 2 and are also attached so as to be arrayed parallel to each other with spaces therebetween.

Finally, the image-acquisition elements 2 including the optical members 6 and the silicon wafer 2b are cut so as to separate numerous image-acquisition devices 1 from each other. In FIGS. 3 and 4, dotted lines B indicate cutting lines. Accordingly, singulated image-acquisition devices 1, such as those shown in FIGS. 1 and 2, are fabricated.

When cutting, the optical members 6 are cut at portions extending across adjacent image-acquisition elements 2 so that the rod-shaped triangular prisms 3 and the cover members 4 are divided lengthwise into multiple pieces and so that a blade does not come into contact with other portions.

With the thus-configured image-acquisition devices 1 according to this embodiment, light that enters from the direction substantially parallel to the image-acquisition surfaces 2a of the image-acquisition elements 2 is deflected 90° by the reflection surfaces 3c, thus making it possible to capture the light with the image-acquisition elements 2. In this case, the image-acquisition devices 1 have the reflection surfaces 3c that are disposed in an inclined manner with respect to the image-acquisition surfaces 2a; however, because the cover members 4, which are attached so as to cover the reflection surfaces 3c, have the outer surfaces 4a that are substantially parallel to the image-acquisition surfaces 2a, there is an advantage in that, when handling the singulated image-acquisition devices 1, they can easily be handled by means of suction at the outer surfaces 4a of the cover members 4 instead of the inclined reflection surfaces 3c. In addition, because the cover members 4 are subjected to the suctioning or the like when handling, the handling is completed without touching the triangular prisms 3 and the image-acquisition elements 2, and thus, there is also an advantage in that it is possible to prevent damaging these parts.

In addition, because the end surfaces 2c of the image-acquisition elements 2 and the edges of the cover members 4 are disposed so as to protrude beyond the entrance surfaces 3a of the triangular prisms 3, even if the image-acquisition devices 1, in the singulated form, are disposed so that the entrance surfaces 3a face downward, the entrance surfaces 3a are protected by the end surfaces 2c of the image-acquisition elements 2 and the edges 4d of the cover members 4, which are disposed so as to protrude beyond the entrance surfaces 3a, so that external objects do not come into contact therewith, and thus, the entrance surfaces 3a can be prevented from being scratched.

In addition, with the method of fabricating the image-acquisition devices 1 according to this embodiment, because the optical members 6 and the image-acquisition elements 2 including the silicon wafer 2b are cut after attaching the optical members 6 so as to extend across numerous image-acquisition elements 2 formed on the silicon wafer 2b, the fabrication time can be reduced by positioning the optical members 6 on numerous image-acquisition elements 2 in a single step, and thus, numerous image-acquisition devices 1 can be fabricated efficiently.

In this case, when cutting, the optical members 6 are merely cut so as to be divided lengthwise, and, because the blade does not come into contact with the entrance surfaces 3a of the triangular prisms 3, the entrance surfaces 3a can be prevented from being scratched.

Note that, in this embodiment, the rectangular columnar optical members 6, in which the triangular prisms 3 and the cover members 4 are attached to each other, are attached so as to extend across numerous image-acquisition elements 2 on the silicon wafer 2b; alternatively, however, the rod-shaped triangular prisms 3 may be attached to the image-acquisition elements 2 first, and the cover members 4 may individually be attached to the reflection surfaces 3c of the individual triangular prisms 3.

Figure 5:
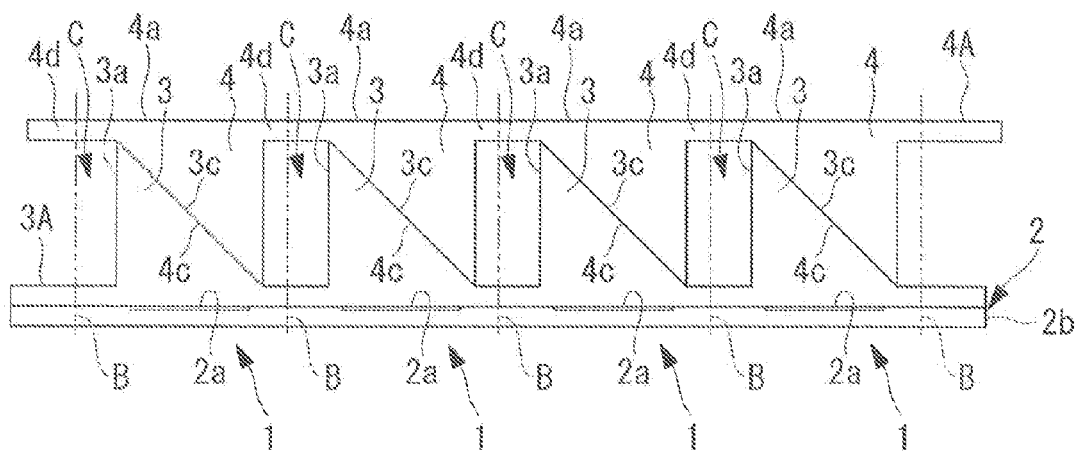
FIG. 5 is a side view showing a first modification of the image-acquisition elements, the triangular prisms, and the cover members in FIG. 3.

In addition, in this embodiment, the plurality of rod-shaped triangular prisms 3 are separately attached to the individual rows of the image-acquisition elements 2 so as to extend across numerous image-acquisition elements 2; alternatively, however, it is permissible to fabricate a prism member 3A in which the plurality of rod-shaped triangular prisms 3 are made into a single unit, as shown in FIG. 5, and the prism member 3A may be attached so as to extend across all image-acquisition elements 2. By doing so, the task of positioning the triangular prisms 3 can be completed in a single step, and thus, the fabrication efficiency can be enhanced further.

In this case, as shown in FIG. 5, a member having such a shape that the entrance surfaces 3a of individual triangular prisms 3 are disposed parallel to each other and the exit surfaces 3b thereof are disposed on the same plane can be employed as the prism member 3A.

In this case, as shown in FIG. 5, it is also preferable that a member having approximately the same shape as the prism member 3A be fabricated as a cover member 4. By doing so, merely by placing the cover member 4A over the prism member 3A in the reverse position, all reflection surfaces 3c of the triangular prisms 3 provided in the prism member 3A can be covered with the covering surfaces 4c of the cover member 4A, and thus, the fabrication efficiency can be enhanced even more.

Also, in this case, it is preferable that the prism member 3A and the cover member 4A be fabricated in such shapes that form gaps C so that the cover member 4A does not come into contact with the individual entrance surfaces 3a when the reflection surfaces 3c and the covering surfaces 4c are brought into close contact. By doing so, the blade does not come into contact with the entrance surfaces 3a when performing the singulation of the image-acquisition devices 1 by cutting the prism member 3A and the cover member 4A at the positions of the gaps, and thus, the entrance surfaces 3a can be prevented from being scratched. In addition, it is possible to fabricate, in a simple manner, the image-acquisition devices 1 in which the end surfaces 2c of the image-acquisition elements 2 and the edges 4d of the cover members 4 protrude with respect to the entrance surfaces 3a.

Figure 6A:
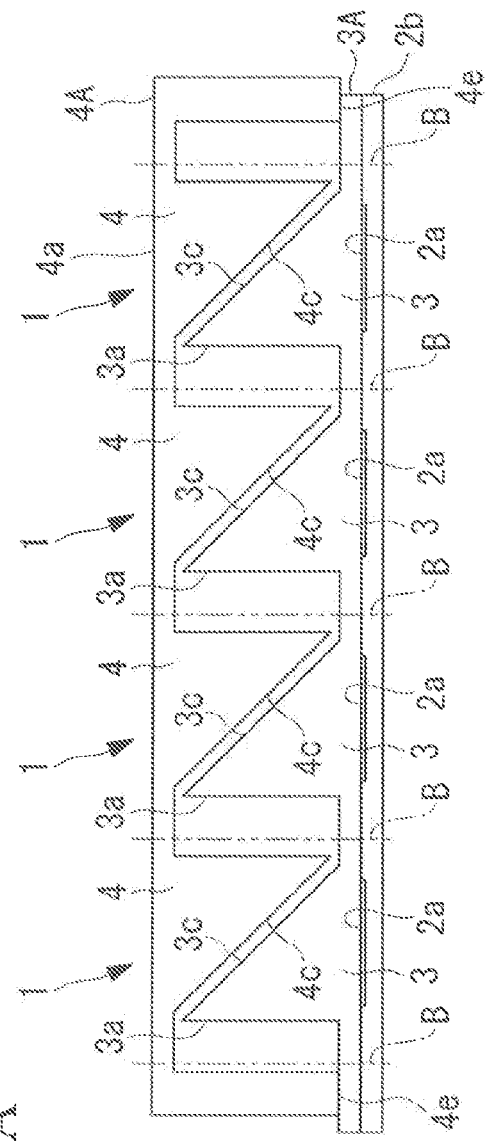
FIG. 6A is a side view showing a second modification of the image-acquisition elements, the triangular prisms, and the cover members in FIG. 3 in a state in which abutting portions are abutted.
Figure 6B:
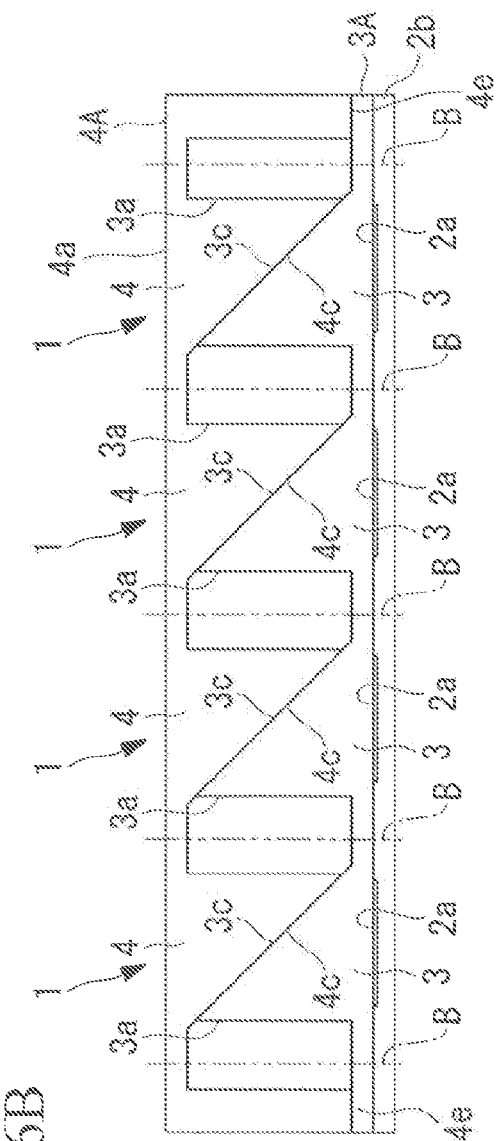
FIG. 6B is a side view showing the second modification of the image-acquisition elements, the triangular prisms, and the cover members in FIG. 3 in a state in which reflection surfaces and covering surfaces are in close contact.

In addition, as shown in FIGS. 6A and 6B, the cover member 4A may be provided with two or more abutting portions 4e that are abutted against surfaces of the prism member 3A that are parallel to the surfaces of the image-acquisition elements 2. By doing so, when attaching the cover member 4A to the prism member 3A, the abutting portions 4e are abutted against the surfaces of the prism member 3A first, thus positioning the cover member 4A with the prism member 3A in the direction parallel to the entrance surfaces 3a, as shown in FIG. 6A, and, by subsequently moving the cover member 4A and the prism member 3A relative to each other in the direction perpendicular to the entrance surfaces 3a in the state in which the abutting portions 4e are abutted against the surfaces of the prism member 3A, as shown in FIG. 6B, the cover member 4A and the prism member 3A can be positioned in a simple, highly precise manner so as to bring the reflection surfaces 3c and the covering surfaces 4c into close contact.

Note that, as shown in FIG. 7, the prism member 3A and the cover member 4A may both be provided with inclined surfaces 3d and 4f that come into close contact at the positions where the reflection surfaces 3c and the covering surfaces 4c are in close contact. The inclined surfaces 3d and 4f should be inclined in the opposite direction with respect to the reflection surfaces 3c in the prism member 3A and in the opposite direction with respect to the covering surfaces 4c in the cover member 4A. As shown in FIG. 7, inclined surfaces 3e and 4g that are inclined in the same direction as the reflection surfaces 3c of the prism member 3A may additionally be provided.

In addition, with the image-acquisition devices 1 according to this embodiment, the entrance surfaces 3a or the exit surfaces 3b of the triangular prisms 3 may be provided with light-blocking members 7 that block light at peripheral portions thereof. By doing so, stray light that enters the image-acquisition surfaces 2a of the image-acquisition elements 2 can be reduced, and thus, a clear image in which flare is suppressed can be acquired.

Figure 9:
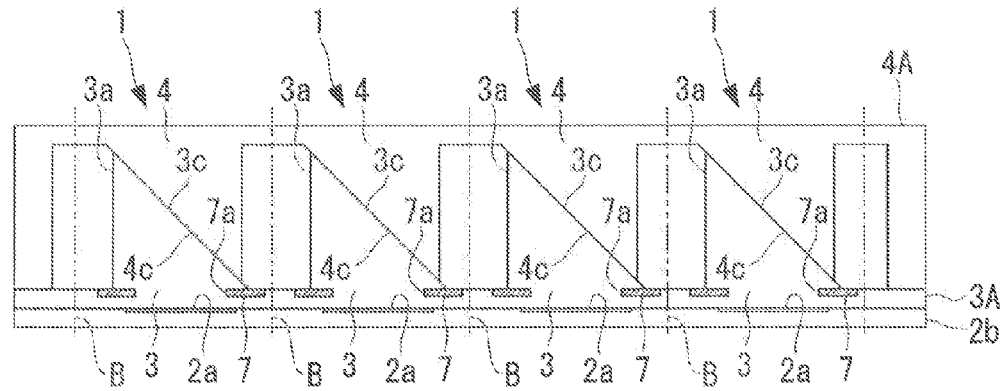
FIG. 9 is a side view showing a fifth modification of the image-acquisition elements, the triangular prisms, and the cover members in FIG. 3 in which exit surfaces are provided with light-blocking members.

Flat plate-shaped members that are attached to the individual entrance surfaces 3a of the rod-shaped prism member 3A, as shown in FIG. 8A, and that have a plurality of through-holes 7a that correspond to the plurality of image-acquisition elements 2, as shown in FIG. 8B, may be attached as the light-blocking members 7. In addition, as shown in FIG. 9, they may be formed at the exit surfaces 3b of the prism member 3A by means of double molding or insert molding.

Figure 10:
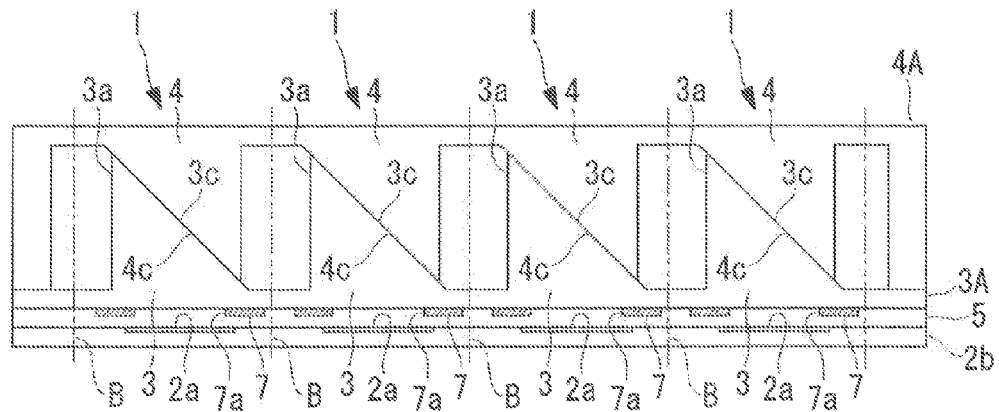
FIG. 10 is a side view showing a sixth modification of the image-acquisition elements, the triangular prisms, and the cover members in FIG. 3 in which the light-blocking members are provided near the exit surfaces.

In addition, as shown in FIG. 10, the light-blocking members 7 may be provided by integrally molding them in a flat plate-shaped transparent member 5 that is attached between the surfaces of the image-acquisition elements 2 and the exit surfaces 3b of the prism member 3A.

In both cases, by cutting everything together with the light-blocking members 7, it is possible to fabricate the image-acquisition devices 1 each of which is provided with the light-blocking member 7 that blocks light at the peripheral portions.

Figure 11:
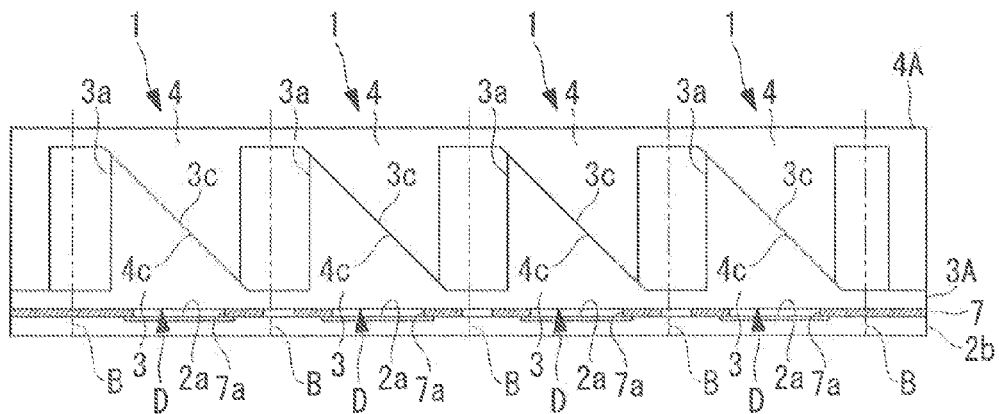
FIG. 11 is a side view showing a seventh modification of the image-acquisition elements, the triangular prisms, and the cover members in FIG. 3 in which air layers are formed between the exit surfaces and the image-acquisition elements by means of the light-blocking members.

Furthermore, as shown in FIG. 11, air layers D may be formed between the surfaces of the image-acquisition elements and the exit surfaces of the prism member by means of light-blocking members having a fixed thickness. Lenses are disposed at the surfaces of these image-acquisition elements, and the lenses are disposed so as to correspond to pixels of the image-acquisition surfaces. In the case in which the thus-configured image-acquisition elements and the prism member are attached to each other, light collection effectiveness of the lenses can be enhanced by the air layers D. The refractive effects of the lenses are greatly affected by the difference in the refractive indices of a medium before and after the point of incidence of the light rays. By providing the air layers D on the entrance side of the lenses, the difference in the refractive indices can be increased, which makes it possible to increase the refractive effects of the lenses, and thus, the light collection effectiveness of the lenses can be increased.

In addition, locations to be cut when the light-blocking members 7 are disposed at the entrance surfaces 3a of the triangular prisms 3 may be at the positions of the gaps C provided between the light-blocking members 7 and the cover members 4; alternatively, intermediate positions in the thickness direction of the light-blocking members 7 may be cut. At both positions, cutting does not cause the blade to scratch the entrance surfaces 3a of the triangular prisms 3.

Figure 12:
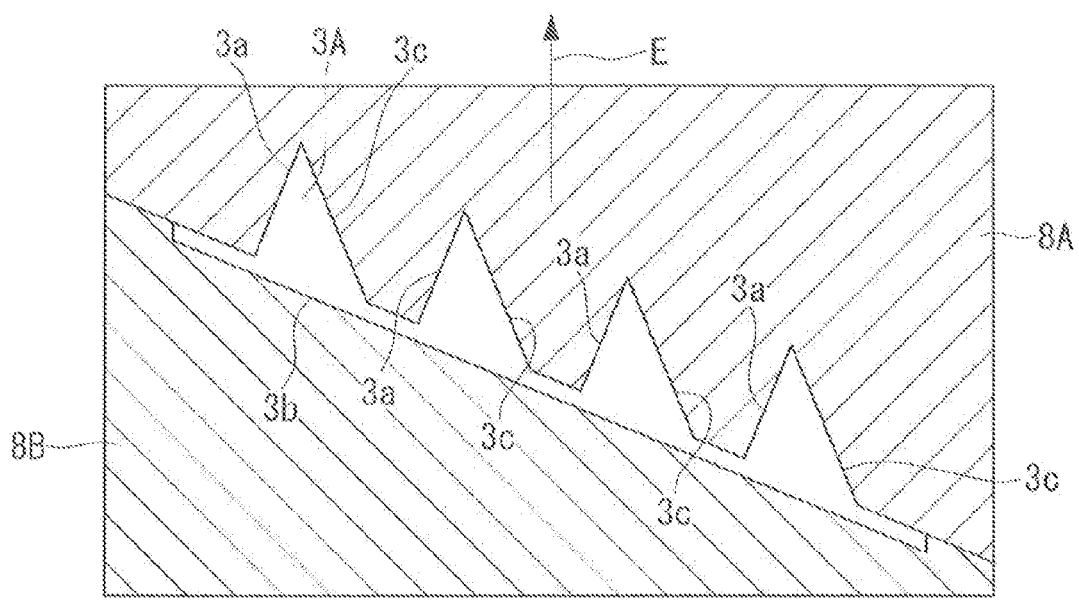
FIG. 12 is a vertical sectional view showing an example of a molding block for a prism member provided with a plurality of the triangular prisms in FIG. 4.

In addition, as shown in FIG. 12, it is preferable that the prism member 3A integrally provided with the plurality of rod-shaped triangular prisms 3 be formed by means of injection molding using molding blocks 8A and 8B that are divided by being moved in intermediate directions E between angles formed by the entrance surfaces 3a and the reflection surfaces 3c of the prism member 3A. By doing so, mold removal can be performed without scratching the entrance surfaces 3a and the reflection surfaces 3c by utilizing the relative angles between the entrance surfaces 3a and the reflection surfaces 3c as draft angles.

Figure 13:
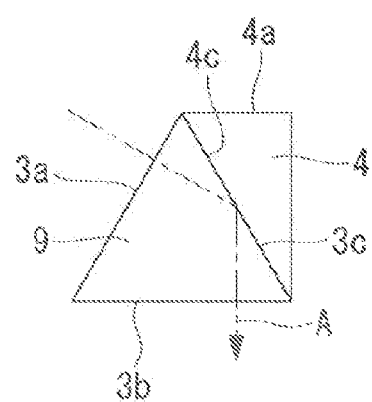
FIG. 13 is a side view showing a first modification of the prism in FIG. 1.
Figure 14:
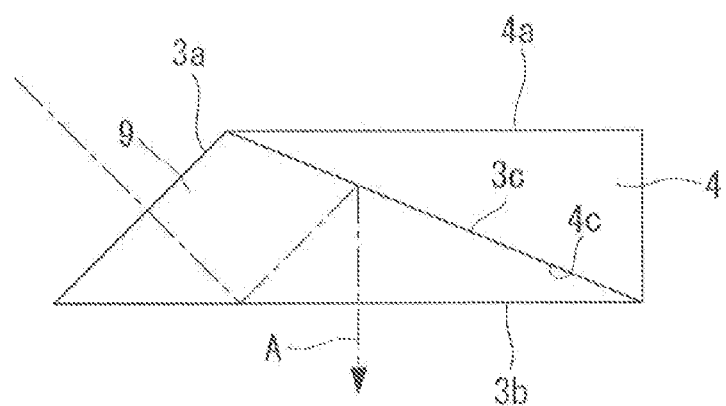
FIG. 14 is a side view showing a second modification of the prism in FIG. 1.
Figure 15:
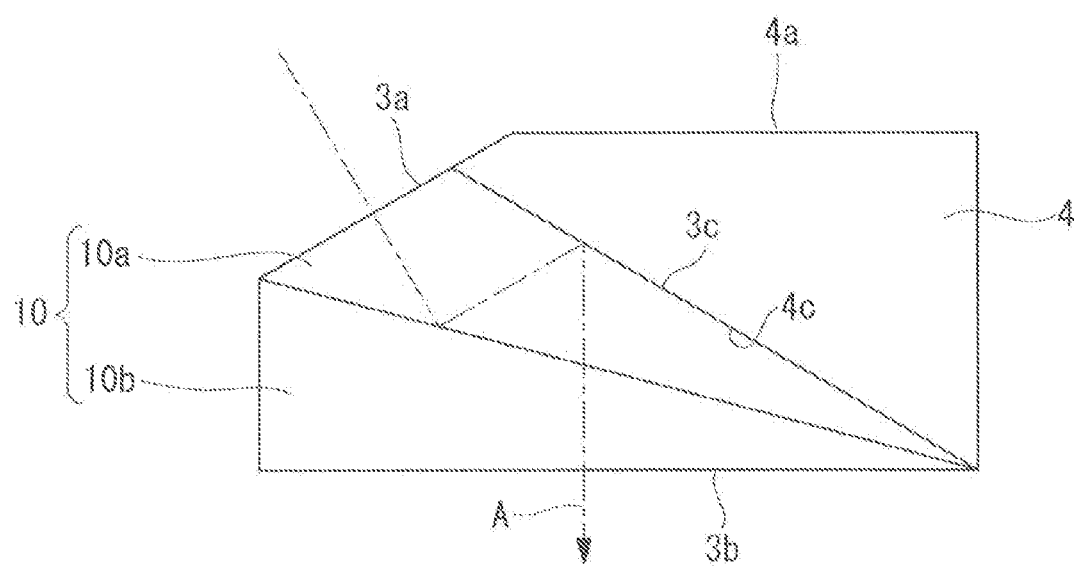
FIG. 15 is a side view showing a third modification of the prism in FIG. 1.
Figure 16:
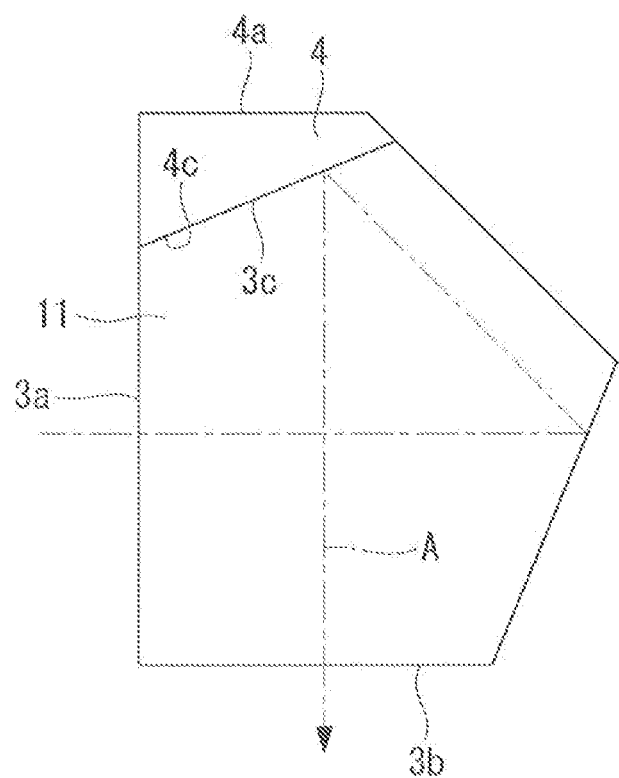
FIG. 16 is a side view showing a fourth modification of the prism in FIG. 1.

In addition, this embodiment has been described in terms of an example in which the triangular prisms 3 having a lateral cross-section in the shape of an isosceles right triangle are employed as the prisms 3 to be attached to the image-acquisition elements 2; alternatively, however, it is permissible to employ triangular prisms 9 having a triangular lateral cross-section other than a right triangle, as shown in FIGS. 13 and 14, prisms 10 in which two or more triangular prisms 10a and 10b are combined, as shown in FIG. 15, or polyhedral prisms 11 having a polygonal cross-section of 4 or more angles, as shown in FIG. 16.

In addition, the cover members 4 and the triangular prisms 3 in this embodiment are formed of materials having greatly differing refractive indices; however, if it is difficult to use materials having greatly differing refractive indices, reflection films formed of a material such as aluminum, silver, or the like may be applied to the reflection surfaces.

With the first aspect of the present invention, when light enters the entrance surface of the prism from the direction that intersects the optical axis of the image-acquisition element, the light that has entered is deflected by the reflection surface of the prism toward the direction that is parallel to the optical axis of the image-acquisition element, exits from the exit surface that is substantially parallel to the image-acquisition surface of the image-acquisition element, and is captured by the image-acquisition element. Specifically, the reflection surface of the prism is disposed in an inclined manner with respect to the optical axis of the image-acquisition element; however, because the cover member is secured at the position where it covers the reflection surface, a singulated image-acquisition device can easily be handled by suctioning the outer surface of the cover member, which is substantially parallel to the image-acquisition surface.

In the above-described first aspect, an end surface of the image-acquisition element closer to the entrance surface may be disposed at a position protruding beyond the entrance surface.

By doing so, during cutting to perform singulation, the entrance surface of the prism can be prevented from being scratched by a blade or the like that cuts the image-acquisition element and the entrance surface can be prevented from being damaged by coming into contact with other objects at the entrance surface after the singulation has been performed, which suppresses scattering of light due to scratches on the entrance surface or damaged portions thereof, thus making it possible to acquire a clear image.

In addition, in the above-described first aspect, an end surface of the cover member closer to the entrance surface may be disposed at a position protruding beyond the entrance surface.

By doing so, during cutting to perform singulation, the entrance surface of the prism can be prevented from being scratched by a blade or the like that cuts the cover member, and the entrance surface can be prevented from being damaged by coming into contact with other objects at the entrance surface after the singulation has been performed, which suppresses scattering of light due to scratches on the entrance surface or damaged portions thereof, thus making it possible to acquire a clear image.

In addition, in the above-described first aspect, the prism may be provided with a plurality of reflection surfaces, and the cover member may be secured at a position where at least one of the reflection surfaces is covered.

By doing so, a singulated image-acquisition device can easily be handled not only in the case of the image-acquisition device having the triangular prism, but even in the case of that having a polyhedral prism or a prism unit in which a plurality of members are combined to cause multiple reflections.

In addition, a second aspect of the present invention is an image-acquisition device formed by securing, so as to extend across a plurality of image-acquisition elements formed on a silicon wafer, a prism having an entrance surface through which light enters from a direction that intersects optical axes of the image-acquisition elements, an exit surface that is substantially parallel to image-acquisition surfaces of the image-acquisition elements, and a reflection surface that deflects the light that has entered through the entrance surface toward a direction that is parallel to the optical axes of the image-acquisition elements; by securing a cover member that has a covering surface, which covers the reflection surface by being brought into close contact with the reflection surface, and an outer surface, which is substantially parallel to the image-acquisition surfaces; and by subsequently performing singulation by cutting the image-acquisition elements including the silicon wafer, the prism, and the cover member in an integrated form.

With the above-described second aspect of the present invention, the image-acquisition device includes the reflection surface that is inclined with respect to the optical axis of the image-acquisition element because the prism is secured so as to extend across the plurality of image-acquisition elements formed on the silicon wafer, the cover member is secured so as to cover the reflection surface of the prism with the covering surface, and the singulation is performed subsequently by cutting the image-acquisition elements including the silicon wafer, the prism, and the cover member in an integrated form; however, the cover member that covers the reflection surface includes the outer surface that is substantially parallel to the image-acquisition surface, and thus, it is possible to provide an image-acquisition device that can easily be handled by suctioning the outer surface thereof.

In the above-described aspect, a light-blocking member that blocks light at a periphery may be disposed at the entrance surface or the exit surface of the prism.

By doing so, a clear image can be obtained by preventing stray light from entering the image-acquisition element by means of the light-blocking member disposed at the periphery.

In addition, in the above-described aspect, a lens may be provided at the image-acquisition surface of the image-acquisition element, and an air layer may be provided between the image-acquisition element and the exit surface of the prism by means of the thickness of the light-blocking member.

By doing so, light exiting from the exit surface of the prism enters pixels of the image-acquisition surface by being collected by the lens provided near the image-acquisition surface. In this case, stray light entering the image-acquisition element can be suppressed by the light-blocking member, and refraction by the lens can also be performed efficiently due to the air layer formed by the thickness of the light-blocking member.

In addition, a third aspect of the present invention is a method of fabricating an image-acquisition device including a step of securing, so as to extend across a plurality of image-acquisition elements formed on a silicon wafer, a prism having an entrance surface through which light enters from a direction that intersects optical axes of the image-acquisition elements, an exit surface that is substantially parallel to image-acquisition surfaces of the image-acquisition elements, and a reflection surface that deflects the light that has entered through the entrance surface toward a direction that is parallel to the optical axes of the image-acquisition elements; a step of securing a cover member that has a covering surface, which covers the reflection surface by being brought into close contact with the reflection surface, and an outer surface, which is substantially parallel to the image-acquisition surfaces; and a step of performing singulation by cutting the image-acquisition elements including the silicon wafer, the prism, and the cover member that has an outer surface that is substantially parallel to the image-acquisition surface in an integrated form.

With the above-described third aspect of the present invention, because the prism is secured so as to extend across the plurality of image-acquisition elements formed on the silicon wafer, the fabrication efficiency can be enhanced by simplifying the task of positioning the prism. Also, the image-acquisition device includes the reflection surface that is inclined with respect to the optical axis of the image-acquisition element because the cover member is secured so as to cover the reflection surface of the prism with the covering surface and the singulation is performed subsequently by cutting the image-acquisition elements including the silicon wafer, the prism, and the cover member in an integrated form; however, the cover member that covers the reflection surface includes the outer surface that is substantially parallel to the image-acquisition surface, and thus, it is possible to fabricate, in a single step, numerous image-acquisition devices that can easily be handled by suctioning the outer surfaces thereof.

In the above-described third aspect, the cover member may be provided with two or more abutting portions that are abutted against surfaces of the image-acquisition elements or planes that are parallel to these surfaces; and, in the step of securing the cover member, after abutting the abutting portions against the surfaces of the image-acquisition elements or the planes that are parallel to these surfaces, the covering surface may be brought into close contact with the reflection surface by moving the abutting portions along the surfaces of the image-acquisition elements or the planes that are parallel to these surfaces.

By doing so, in the state in which the distance between the cover member and the image-acquisition elements is fixed by means of the abutting portions that are abutted against the surfaces of the image-acquisition elements or the planes that are parallel to these surfaces, the covering surface of the cover member can reliably be brought into close contact with the reflection surface of the prism by moving the abutting portions along the surfaces of the image-acquisition elements or the planes that are parallel to these surfaces. Accordingly, the cover member can be secured, in a simple manner, to the prism in the positioned state.

In addition, the above-described third aspect may include a step of fabricating a prism member in which a plurality of the prisms are made into a single unit so that the entrance surfaces are disposed parallel to each other with spaces therebetween and so that the exit surfaces are disposed on the same plane, and the prism member may be secured in the step of securing the prism.

By doing so, merely by securing the prism member to the image-acquisition elements formed on the silicon wafer, the plurality of prisms can be secured by positioning them in a single step, and thus, the fabrication efficiency can be enhanced.

In addition, the above-described third aspect may include a step of fabricating a cover member having substantially the same shape as the prism member, and, in the step of securing the cover member, covering surfaces of the cover member may be secured to reflection surfaces of the prism member so as to form gaps between the individual entrance surfaces of the prism member and the cover member.

By doing so, merely by placing the cover member over the prism member in the reverse position, all reflection surfaces can be covered with the covering surfaces, and thus, the fabrication efficiency can be enhanced further. In this case, because the cover member is secured so that the gaps are formed between the individual entrance surfaces of the prism member and the cover member, the singulated image-acquisition devices can be formed without allowing the blade to come into contact with the entrance surfaces of the prism member by cutting at the positions of the gaps when cutting the cover member, the prism member, and the silicon wafer including the image-acquisition elements.

In addition, in the above-described third aspect, in the step of fabricating the prism member, injection molding may be employed using molding blocks that are divided by being moved in intermediate directions between angles formed by the reflection surfaces and the entrance surfaces.

By doing so, the prism member can be fabricated in a simple manner by utilizing the relative angles between the reflection surfaces and the entrance surfaces as draft angles for the molding blocks.

The present invention affords an advantage in that fabrication is possible in a simple manner and that easy handling is possible by means of suction even in a singulated form.

REFERENCE SIGNS LIST

A optical axis
D air layer
1 image-acquisition device 2 image-acquisition element
2a image-acquisition surface
2b silicon wafer
2c end surface
3, 9, 10a, 10b triangular prism (prism)
3A prism member (prism)
3a entrance surface
3b exit surface
3c reflection surface
4 cover member
4A cover member
4a outer surface
4c covering surface
4d edge
4e abutting portion
7 light-blocking member
8A, 8B molding block
10 prism
11 polyhedral prism (prism)

The invention claimed is:

1. An image-acquisition device comprising:
an image-acquisition element;
a prism that is secured to the image-acquisition element and that has an entrance surface through which light enters from a direction that intersects an optical axis of the image-acquisition element, an exit surface that is substantially parallel to an image-acquisition surface of the image-acquisition element, and a reflection surface that deflects the light that has entered through the entrance surface toward a direction that is parallel to the optical axis of the image-acquisition element; and
a cover member that is secured at a position that covers the reflection surface of the prism and that has an outer surface that is substantially parallel to the image-acquisition surface,
wherein an end surface of the cover member closer to the entrance surface is disposed at a position protruding beyond the entrance surface, and
wherein the exit surface of the prism is in direct surface contact with the image-acquisition element.

2. The image-acquisition device according to claim 1, wherein an end surface of the image-acquisition element closer to the entrance surface is disposed at a position protruding beyond the entrance surface.

3. The image-acquisition device according to claim 1, wherein the prism is provided with a plurality of reflection surfaces, and the cover member is secured at a position where at least one of the reflection surfaces is covered.

4. The image-acquisition device according to claim 1, wherein a light-blocking member that blocks light at a periphery is disposed at the entrance surface or the exit surface of the prism.

5. The image-acquisition device according to claim 4,
wherein a lens is provided at the image-acquisition surface of the image-acquisition element, and
an air layer is provided between the image-acquisition element and the exit surface of the prism by means of the thickness of the light-blocking member.

6. An imaqe-acquisition device comprising:
an image-acquisition element;
a prism that is secured to the image-acquisition element and that has an entrance surface through which light enters from a direction that intersects an optical axis of the image-acquisition element, an exit surface that is substantially parallel to an image-acquisition surface of the image-acquisition element, and a reflection surface that deflects the light that has entered through the entrance surface toward a direction that is parallel to the optical axis of the image-acquisition element; and
a cover member that is secured at a position that covers the reflection surface of the prism and that has an outer surface that is substantially parallel to the image-acquisition surface,
wherein an end surface of the cover member closer to the entrance surface is disposed at a position protruding beyond the entrance surface, and
wherein a light-blocking member is in direct surface contact with the image-acquisition element, and the prism is in direct surface contact with the light-blocking member.

7. An image-acquisition device comprising:
an image-acquisition element;
a prism that is secured to the image-acquisition element and that has an entrance surface through which light enters from a direction that intersects an optical axis of the image-acquisition element, an exit surface that is substantially parallel to an image-acquisition surface of the image-acquisition element, and a reflection surface that deflects the light that has entered through the entrance surface toward a direction that is parallel to the optical axis of the image-acquisition element; and
a cover member that is secured at a position that covers the reflection surface of the prism and that has an outer surface that is substantially parallel to the image-acquisition surface,
wherein an end surface of the cover member closer to the entrance surface is disposed at a position protruding beyond the entrance surface, and
wherein a transparent member including a light-blocking member is in direct surface contact with the image-acquisition element, and the prism is in direct surface contact with the transparent member.

* * * * *